US007046375B2

(12) United States Patent
Bischoff et al.

(10) Patent No.: US 7,046,375 B2
(45) Date of Patent: May 16, 2006

(54) EDGE ROUGHNESS MEASUREMENT IN OPTICAL METROLOGY

(75) Inventors: Joerg Bischoff, Ilmenau (DE); Emmanuel Drege, San Jose, CA (US); Sanjay Yedur, San Ramon, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 362 days.

(21) Appl. No.: 10/428,186

(22) Filed: May 2, 2003

(65) Prior Publication Data

US 2004/0218192 A1    Nov. 4, 2004

(51) Int. Cl.
*G01B 11/30* (2006.01)
(52) U.S. Cl. .................................. 356/600; 250/559.22
(58) Field of Classification Search ................ 356/600, 356/511, 445; 250/559.19, 559.22
See application file for complete search history.

(56) References Cited

U.S. PATENT DOCUMENTS

| 4,408,884 A | * | 10/1983 | Kleinknecht et al. ....... 356/496 |
| 5,002,631 A | * | 3/1991 | Giapis et al. ................. 216/60 |
| 6,256,100 B1 | * | 7/2001 | Banet et al. ................. 356/432 |
| 2002/0018217 A1 | * | 2/2002 | Weber-Grabau et al. .... 356/601 |

OTHER PUBLICATIONS

I.B.M Technical Disclosure Bulletin, Optical Determination of Semiconductor Device Edge Profiles, Jul. 1, 1976, p. Nos. 474-477 (Document No. NN7607474).*

* cited by examiner

*Primary Examiner*—Gregory J. Toatley, Jr.
*Assistant Examiner*—Roy M. Punnoose
(74) *Attorney, Agent, or Firm*—Morrison & Foerster LLP

(57) ABSTRACT

Edge roughness and deterministic profile of a structure formed on a semiconductor wafer are measured using optical metrology by directing an incident beam on the structure using a source and receiving the diffracted beam from the structure using a detector. The received diffracted beam is processed using a processor to determine a deterministic profile of the structure and to measure an edge roughness of the structure.

46 Claims, 10 Drawing Sheets

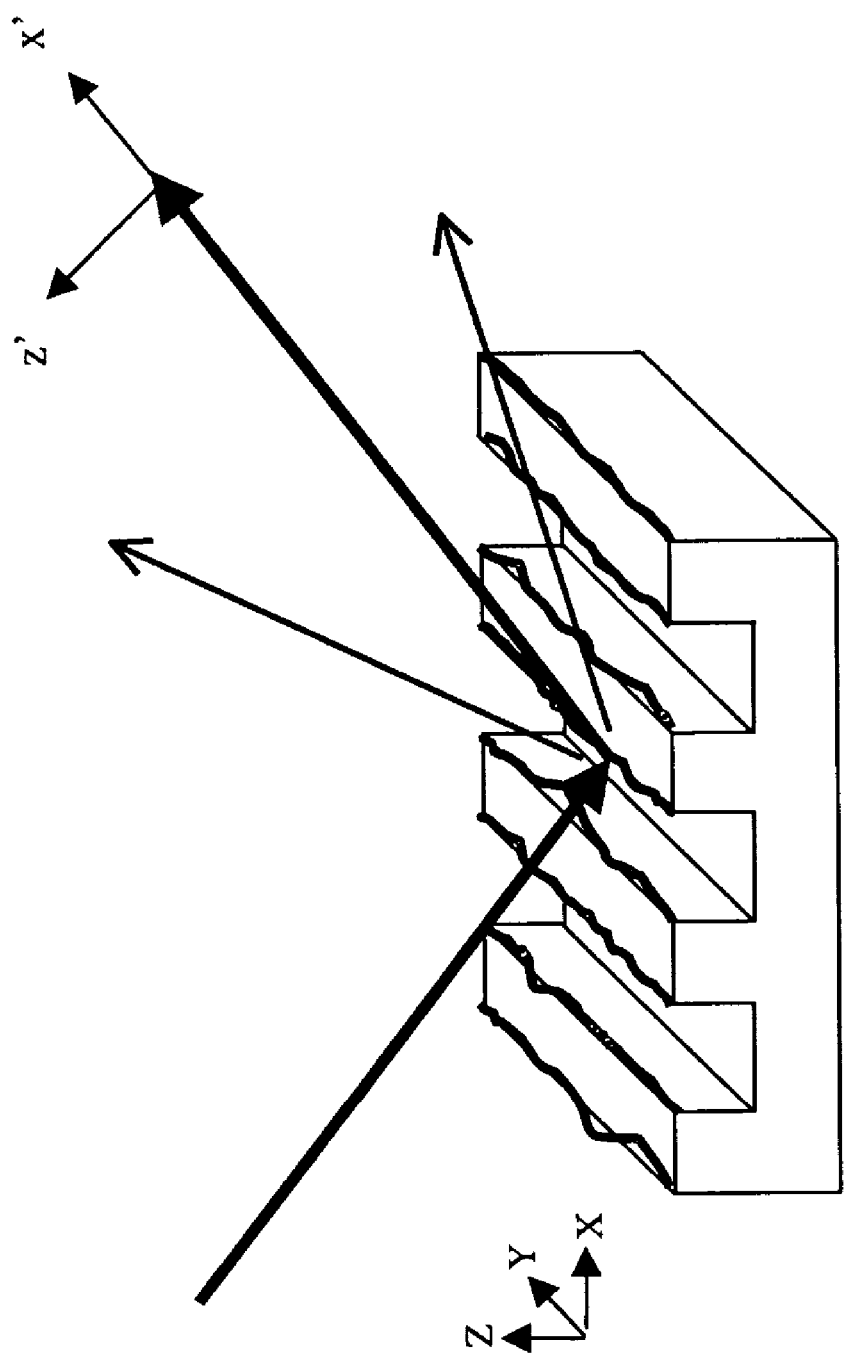
Fig. 6-A

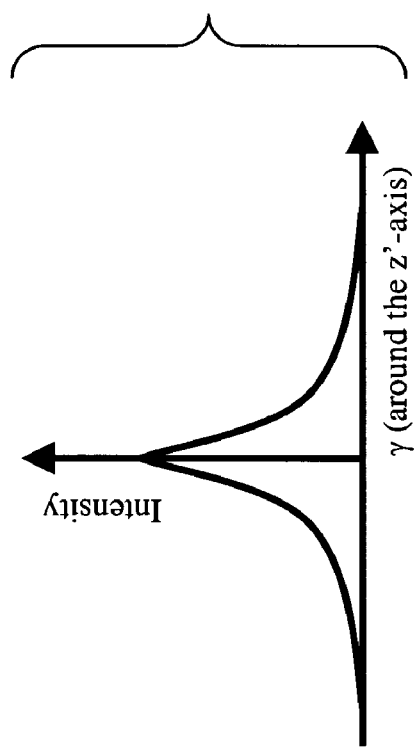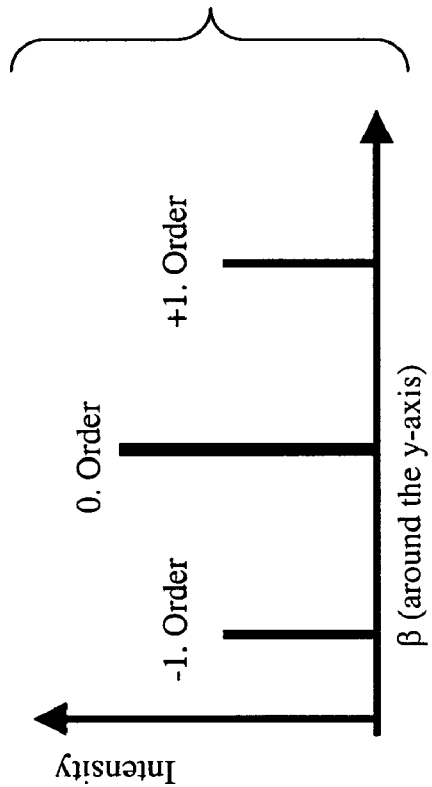

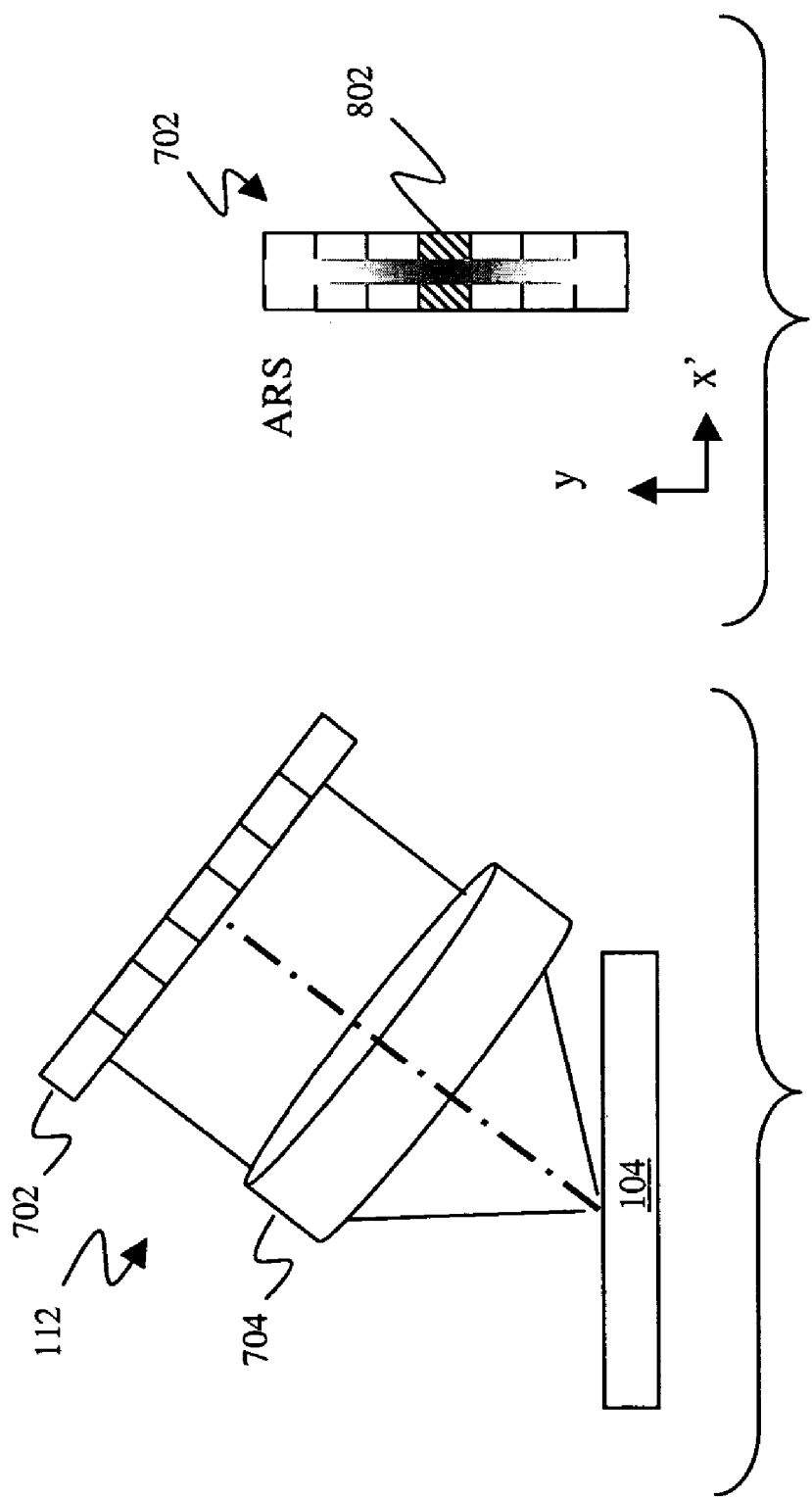

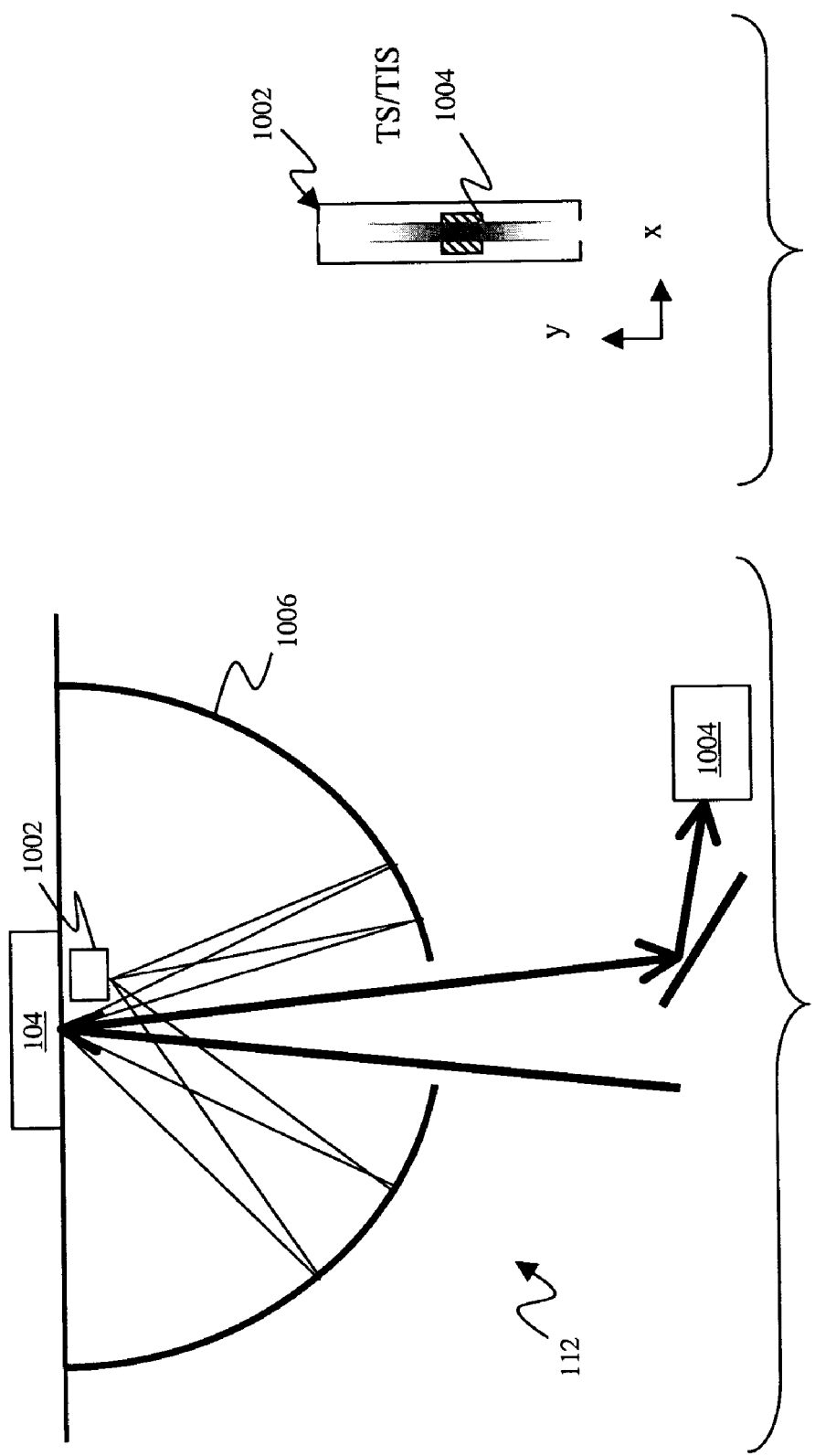

EDGE ROUGHNESS MEASUREMENT IN OPTICAL METROLOGY

BACKGROUND

1. Field of the Invention

The present invention relates to optical metrology, and more particularly to edge roughness measurement in optical metrology.

2. Related Art

Optical metrology involves directing an incident beam at a structure, measuring the resulting diffracted beam, and analyzing the diffracted beam to determine various characteristics, such as the profile of the structure. In semiconductor manufacturing, optical metrology is typically used for quality assurance. For example, after fabricating a periodic grating in proximity to a semiconductor chip on a semiconductor wafer, an optical metrology system is used to determine the profile of the periodic grating. By determining the profile of the periodic grating, the quality of the fabrication process utilized to form the periodic grating, and by extension the semiconductor chip proximate the periodic grating, can be evaluated.

Conventional optical metrology is used to determine the deterministic profile of a structure formed on a semiconductor wafer. For example, conventional optical metrology is used to determine the critical dimension of a structure. However, the structure may be formed with various stochastic effects, such as edge roughness, which are not measured using conventional optical metrology.

SUMMARY

In one exemplary embodiment, edge roughness and deterministic profile of a structure formed on a semiconductor wafer are measured using optical metrology by directing an incident beam on the structure using a source and receiving the diffracted beam from the structure using a detector. The received diffracted beam is processed using a processor to determine a deterministic profile of the structure and to measure an edge roughness of the structure.

DESCRIPTION OF DRAWING FIGURES

Figure 1:
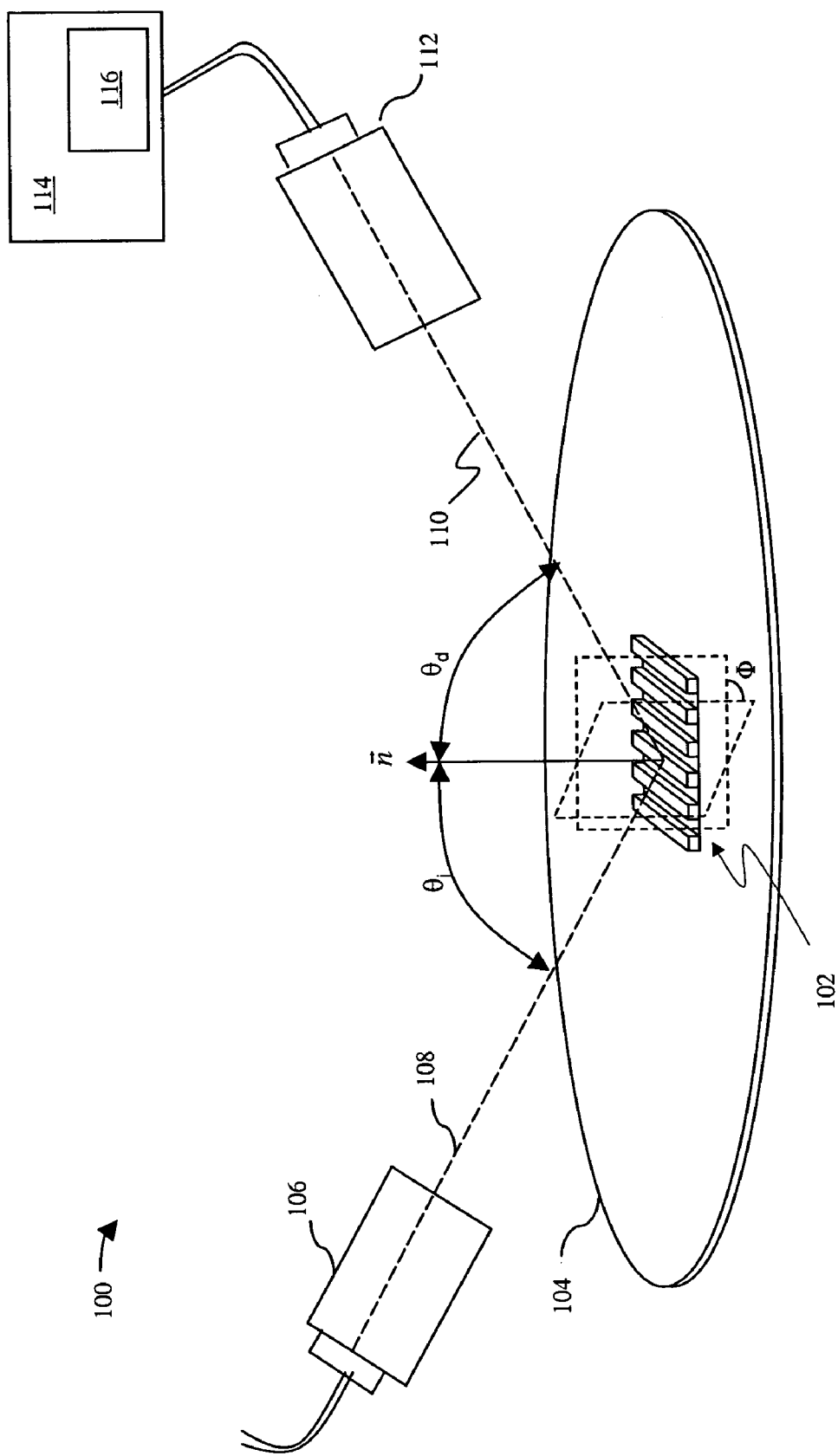
Figure 3:
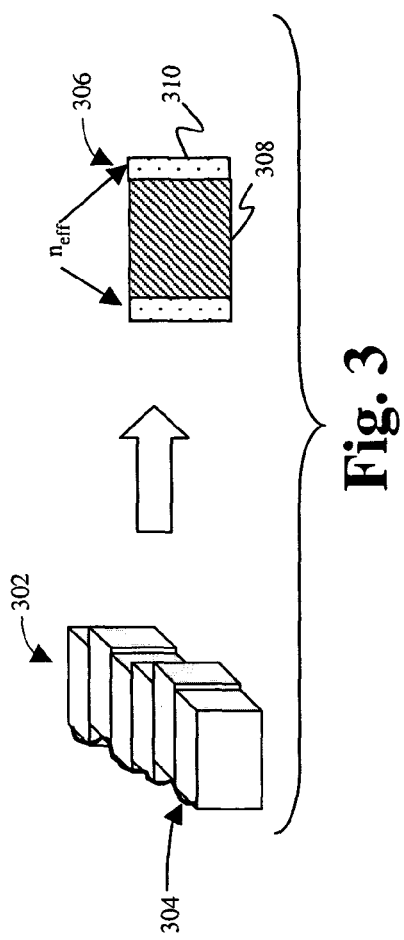
Figure 4:
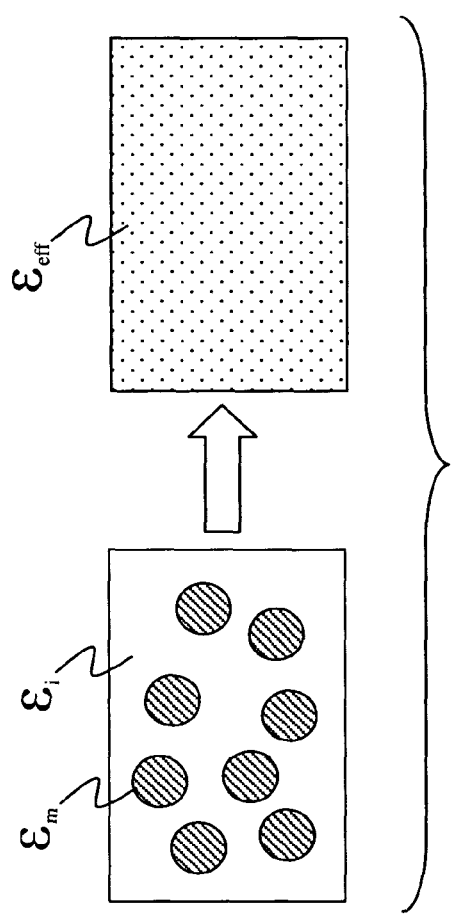
Figure 5:
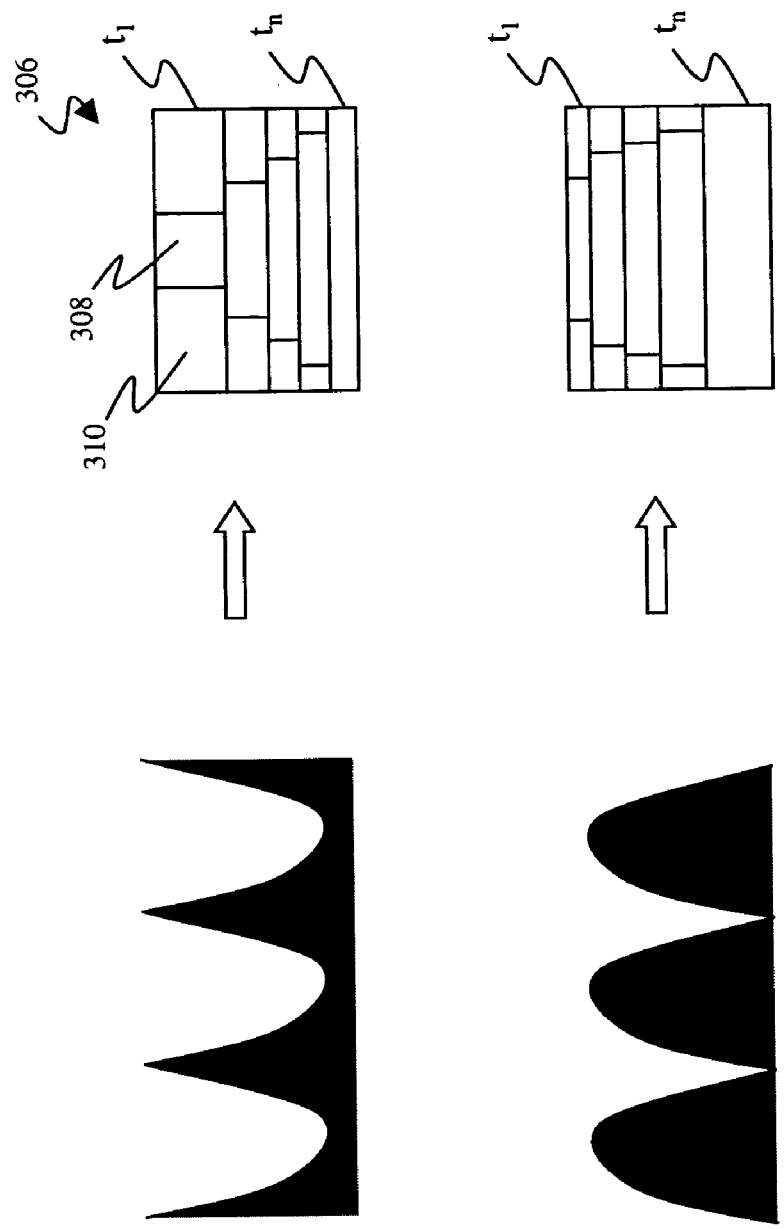
Figure 9:
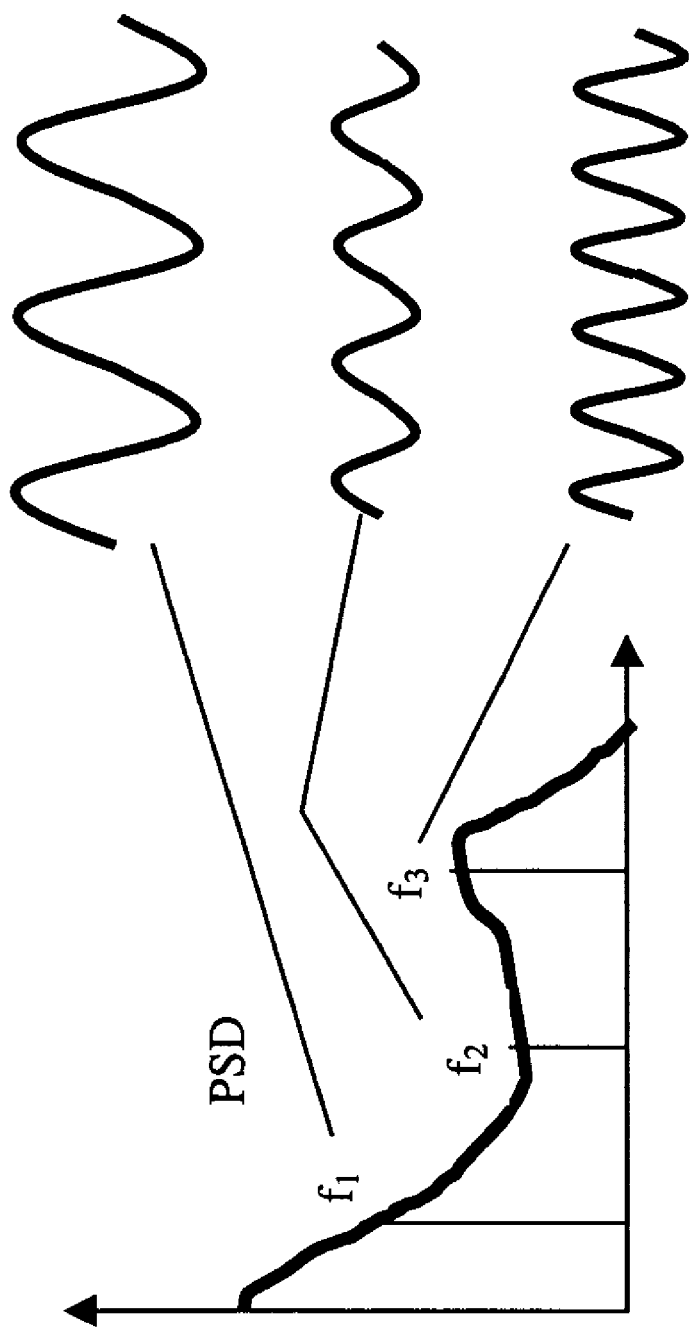
Figure 13:
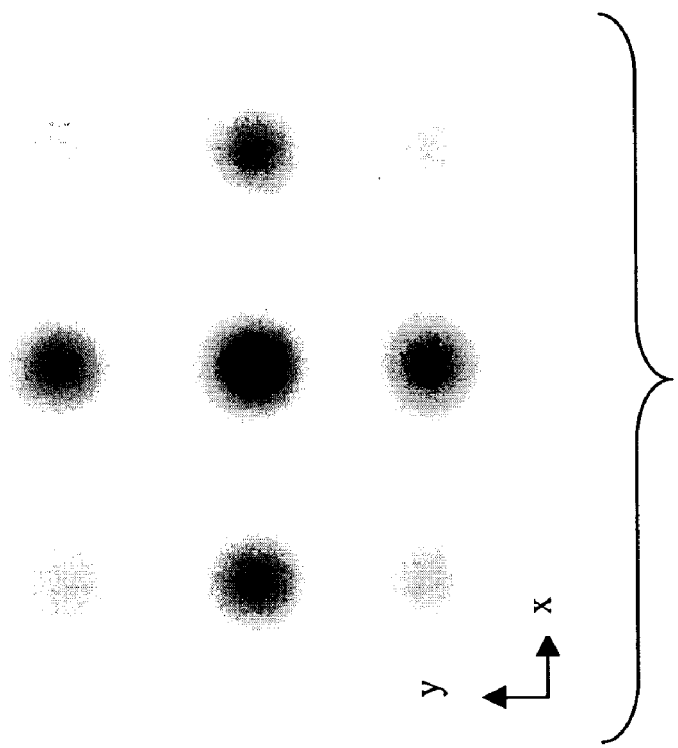
Figure 12:
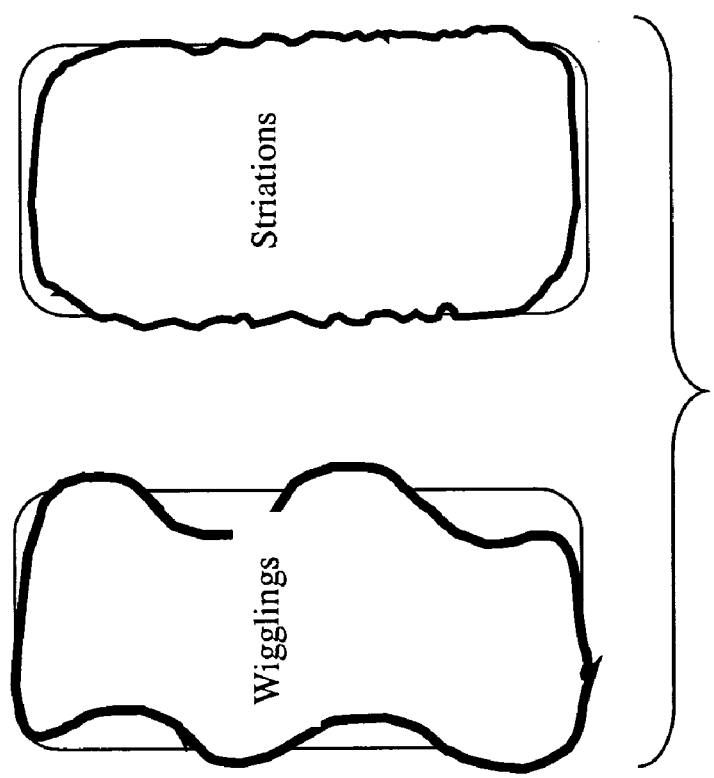

The present invention can be best understood by reference to the following description taken in conjunction with the accompanying drawing figures, in which like parts may be referred to by like numerals:

FIG. 1 depicts an exemplary optical metrology system;
FIGS. 2A–2E depict exemplary profiles of an exemplary periodic grating;
FIG. 3 depicts a structure having a rough edge;
FIG. 4 depicts an exemplary inhomogeneous medium and an exemplary effective medium;
FIG. 5 depicts exemplary representative structures;
FIG. 6-A depicts an exemplary periodic grating;
FIG. 6-B depicts a scattering pattern;
FIG. 6-C depicts an intensity distribution;
FIGS. 7 and 8 depict portions of an exemplary detector;
FIG. 9 depicts an exemplary power spectrum density graph;
FIGS. 10 and 11 depict portions of another exemplary detector;
FIG. 12 depicts exemplary two dimensional structures; and
FIG. 13 depicts an exemplary diffraction/scatter pattern.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology

With reference to FIG. 1, an optical metrology system 100 can be used to examine and analyze a structure. For example, optical metrology system 100 can be used to determine the profile of a periodic grating 102 formed on wafer 104. As described earlier, periodic grating 102 can be formed in test areas on wafer 104, such as adjacent to a device formed on wafer 104. Alternatively, periodic grating 102 can be formed in an area of the device that does not interfere with the operation of the device or along scribe lines on wafer 104.

As depicted in FIG. 1, optical metrology system 100 can include a photometric device with a source 106 and a detector 112. Periodic grating 102 is illuminated by an incident beam 108 from source 106. In the present exemplary embodiment, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. Detector 112 converts the diffracted beam 110 into a measured diffraction signal.

To determine the profile of periodic grating 102, optical metrology system 100 includes a processing module 114 configured to receive the measured diffraction signal and analyze the measured diffraction signal. As described below, the profile of periodic grating 102 can then be determined using a library-based process or a regression-based process. Additionally, other linear or non-linear profile extraction techniques are contemplated.

2. Library-Based Process of Determining Profile of Structure

In a library-based process of determining the profile of a structure, the measured diffraction signal is compared to a library of simulated diffraction signals. More specifically, each simulated diffraction signal in the library is associated with a hypothetical profile of the structure. When a match is made between the measured diffraction signal and one of the simulated diffraction signals in the library or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, after obtaining a measured diffraction signal, processing module 114 then compares the measured diffraction signal to simulated diffraction signals stored in a library 116. Each simulated diffraction signal in library 116 can be associated with a hypothetical profile. Thus, when a match is made between the measured diffraction signal and one of the simulated diffraction signals in library 116, the hypothetical profile associated with the matching simulated diffraction signal can be presumed to represent the actual profile of periodic grating 102.

The set of hypothetical profiles stored in library 116 can be generated by characterizing a hypothetical profile using a set of parameters, then varying the set of parameters to generate hypothetical profiles of varying shapes and dimensions. The process of characterizing a profile using a set of parameters can be referred to as parameterizing.

Figure 2E:
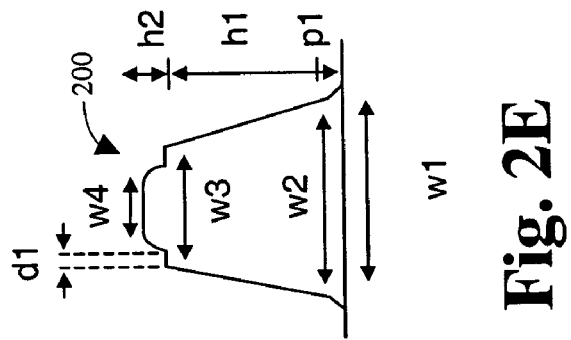
Figure 2C:
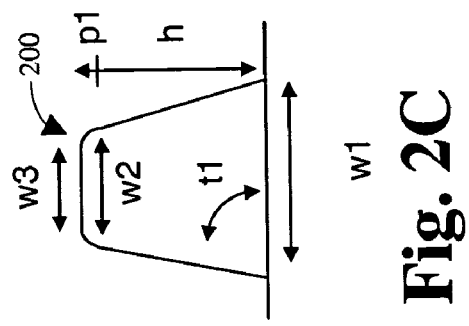
Figure 2D:
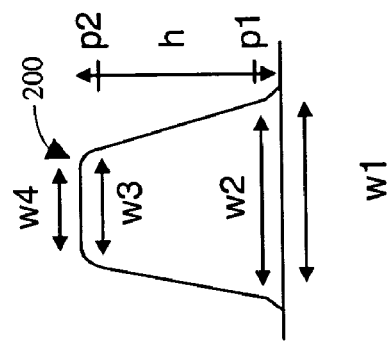
Figure 2A:
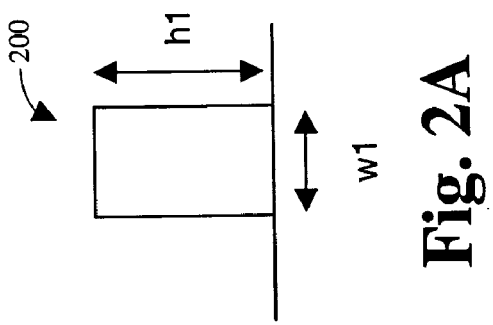
Figure 2B:
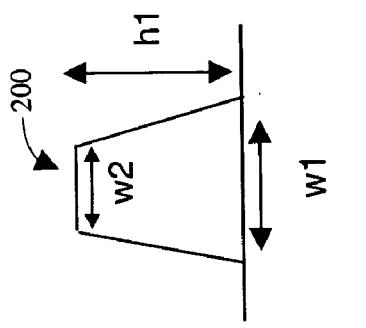

For example, as depicted in FIG. 2A, assume that hypothetical profile 200 can be characterized by parameters h1 and w1 that define its height and width, respectively. As depicted in FIGS. 2B to 2E, additional shapes and features of hypothetical profile 200 can be characterized by increasing the number of parameters. For example, as depicted in FIG. 2B, hypothetical profile 200 can be characterized by parameters h1, w1, and w2 that define its height, bottom width, and top width, respectively. Note that the width of hypothetical profile 200 can be referred to as the critical dimension (CD). For example, in FIG. 2B, parameter w1 and w2 can be described as defining the bottom CD and top CD, respectively, of hypothetical profile 200.

As described above, the set of hypothetical profiles stored in library 116 (FIG. 1) can be generated by varying the parameters that characterize then hypothetical profile. For example, with reference to FIG. 2B, by varying parameters h1, w1, and w2, hypothetical profiles of varying shapes and dimensions can be generated. Note that one, two, or all three parameters can be varied relative to one another.

With reference again to FIG. 1, the number of hypothetical profiles and corresponding simulated diffraction signals in the set of hypothetical profiles and simulated diffraction signals stored in library 116 (i.e., the resolution and/or range of library 116) depends, in part, on the range over which the set of parameters and the increment at which the set of parameters are varied. In one exemplary embodiment, the hypothetical profiles and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using AFM, X-SEM, and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-Based Process of Determining Profile of Structure

In a regression-based process of determining the profile of a structure, the measured diffraction signal is compared to a simulated diffraction signal (i.e., a trial diffraction signal). The simulated diffraction signal is generated prior to the comparison using a set of parameters (i.e., trial parameters) for a hypothetical profile (i.e., a hypothetical profile). If the measured diffraction signal and the simulated diffraction signal do not match or when the difference of the measured diffraction signal and one of the simulated diffraction signals is not within a preset or matching criterion, another simulated diffraction signal is generated using another set of parameters for another hypothetical profile, then the measured diffraction signal and the newly generated simulated diffraction signal are compared. When the measured diffraction signal and the simulated diffraction signal match or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, processing module 114 can generate a simulated diffraction signal for a hypothetical profile, and then compare the measured diffraction signal to the simulated diffraction signal. As described above, if the measured diffraction signal and the simulated diffraction signal do not match or when the difference of the measured diffraction signal and one of the simulated diffraction signals is not within a preset or matching criterion, then processing module 114 can iteratively generate another simulated diffraction signal for another hypothetical profile. In one exemplary embodiment, the subsequently generated simulated diffraction signal can be generated using an optimization algorithm, such as global optimization techniques, which includes simulated annealing, and local optimization techniques, which includes steepest descent algorithm.

In one exemplary embodiment, the simulated diffraction signals and hypothetical profiles can be stored in a library 116 (i.e., a dynamic library). The simulated diffraction signals and hypothetical profiles stored in library 116 can then be subsequently used in matching the measured diffraction signal.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

4. Rigorous Coupled Wave Analysis

As described above, simulated diffraction signals are generated to be compared to measured diffraction signals. In one exemplary embodiment, simulated diffraction signals can be generated by applying Maxwell's equations and using a numerical analysis technique to solve Maxwell's equations, such as rigorous coupled-wave analysis (RCWA). It should be noted, however, that various numerical analysis techniques, including variations of RCWA, can be used. For a more detail description of RCWA, see U.S. patent application Ser. No. 09/770,997, titled CACHING OF INTRA-LAYER CALCULATIONS FOR RAPID RIGOROUS COUPLED-WAVE ANALYSES, filed on Jan. 25, 2001, which is incorporated herein by reference in its entirety.

5. Measuring Edge Roughness

As described above, optical metrology can be used to determine the profile of a structure formed on a semiconductor wafer. More particularly, various deterministic characteristics of the structure (e.g., height, width, critical dimension, line width, and the like) can be determined using optical metrology. Thus the profile of the structure obtained using optical metrology is the deterministic profile of the structure. However, the structure may be formed with various stochastic effects, such as line edge roughness, slope roughness, and the like. Thus, to more accurately determine the overall profile of the structure, in one exemplary embodiment, these stochastic effects are also measured using optical metrology. It should be recognized that the term line edge roughness or edge roughness is typically used to refer to roughness characteristics of structures other than just lines. For example, the roughness characteristic of a 2-dimensional structure, such as a vias or hole, is also often referred to as a line edge roughness or edge roughness. Thus, in the following description, the term line edge roughness or edge roughness is also used in this broad sense.

As depicted in FIG. 3, a structure 302 can be formed with an edge 304 that is rough rather than uniform. It should be recognized that structure 302 can be various types of structures formed on a semiconductor wafer, such as periodic gratings, lines, vias, holes, and the like. One conventional measure of roughness is a root-means-square (rms) roughness, which describes the fluctuations of surface heights around an average surface height.

More particularly, the Rayleigh criterion or Rayleigh smooth surface limit is:

$$\left(\frac{4\pi\sigma \cdot \cos\theta_i}{\lambda}\right)^2 \ll 1$$

with $\sigma$ being the rms of the stochastic surface, $\lambda$ the probing wavelength and $\theta_i$ the (polar) angle of incidence. The root mean square $\sigma$ is defined in terms of surface height deviations from the mean surface as:

$$\sigma = \left(\lim_{L\to\infty}\frac{1}{L}\int_{-\frac{L}{2}}^{\frac{L}{2}}[z(x)-\bar{z}]^2 dx\right)^{\frac{1}{2}}$$

The (one-dimensional) Power Spectrum Density (PSD) of a surface is the squared Fourier integral of $z(x)$:

$$PSD(f_x) = \lim_{L\to\infty}\frac{1}{L}\left|\int_{-\frac{L}{2}}^{\frac{L}{2}}z(x)\cdot e^{-j2\pi f_x x}dx\right|^2$$

Here, $f_x$ is the spatial frequency in x-direction. Because the PSD is symmetric, it is fairly common to plot only the positive frequency side. Some characteristic PSD-functions are Gaussian, exponential and fractal.

The rms can be derived directly from the zeroth moment of the PSD as follows:

$$\sigma = 2\int_{f_{min}}^{f_{max}}(2\pi f_x)^0 \cdot PSD(f_x)df_x$$

Note that the measured rms is bandwidth limited due to measurement limitations. More particularly, the least spatial frequency $f_{min}$ is determined by the closest-to-specular resolved scatter angle and $f_{max}$ is determined by the evanescent cutoff. Both scale with the probing wavelength via the grating equation, i.e., lower wavelengths enable access to higher spatial frequencies and higher wavelength enable lower spatial frequencies to detect.

A stochastic surface can also be described using an auto-correlation function (ACF), meaning a self-convolution of the surface expressed by:

$$ACF(\tau) = \lim_{L\to\infty}\frac{1}{L}\int_{-\frac{L}{2}}^{\frac{L}{2}}z(x)\cdot z(x+\tau)dx$$

According to the Wiener-Khinchin theorem, the PSD and the ACF are a Fourier transform pair. Thus they expressing the same information differently.

The PSD is also directly proportional to a Bi-directional Scatter Distribution Function (BSDF). For smooth-surface statistics (i.e., when the Rayleigh criterion is met), the BSDF is equal to the ratio of differential radiance to differential irradiance, which is measured using angle-resolved scattering (ARS) techniques.

In Total Integrated Scattering (TIS), the scattered light is integrated with a reflecting sphere (e.g., a Coblentz sphere) and directed to a detector while the specular light is blocked. In smooth surface approximation, the TIS measurement is correlated to the surface rms roughness $\sigma$ by:

$$TIS = \left(\frac{4\pi\sigma \cdot \cos\theta_i}{\lambda}\right)^2$$

It should be recognized that the roughness of a surface can be defined using various roughness measurements. See, John C. Stover, "Optical Scattering," SPIE Optical Engineering Press, Second Edition, Bellingham Wash. 1995, which is incorporated herein by reference in its entirety.

In one exemplary embodiment, the roughness of edge 304 (i.e., the edge roughness) can be modeled in optical metrology as a random spatial critical dimension (CD) variation. More particularly, with reference to FIG. 4, the optical properties of an inhomogeneous medium may be described by a complex dielectric function and a complex magnetic permeability, each of which is a function of position. If the wavelength of the electromagnetic radiation (i.e., the incident beam) used to measure the inhomogeneous medium is much larger than the particle size (e.g., for normal incidence with wavelength greater than 1.3 of the spatial period), classical theories of inhomogeneous media presume that the material can be treated as a homogeneous substance with an effective dielectric function and effective magnetic permeability. These quantities depend upon the properties of the constituents, as well as their volume fractions and sizes. In the general case, the resulting effective material will be anisotropic, i.e., the effective refraction index is a tensor.

Thus, with reference again to FIG. 3, in the present exemplary embodiment, a simulated diffraction signal for structure 302 having rough edges 304 can be generated for optical metrology using a representative structure 306. As depicted in FIG. 3, representative structure 306 includes a homogeneous area 308 and edges 310. In generating a simulated diffraction signal for structure 306, the refraction index used for homogenous area 308 is assumed to be the same as that of structure 302 (e.g., resist). The refraction index used for edges 310 is assumed to be an effective refraction index, which is an average between the two materials that form the rough interface (e.g., resist and air).

For example, assuming an azimuth angle of zero, the effective refraction index for TE-and TM-polarized light can be derived using the following:

$$TE: \varepsilon = \frac{w_1 \cdot \varepsilon_1 + w_2 \cdot \varepsilon_2}{w_1 + w_2}$$

$$TM: \varepsilon^{-1} = \frac{w_1 \cdot \varepsilon_1^{-1} + w_2 \cdot \varepsilon_2^{-1}}{w_1 + w_2}$$

$w_1$ and $w_2$ are weighing factors corresponding to percentage of volume. For example, if the volume of edge 304 includes 20 percent material 1 (e.g., resist) and 80 percent material 2 (e.g., air), then $w_1$ is 0.2 and $w_2$ is 0.8. The effective refraction index can then be used in generating a simulated diffraction signal used in optical metrology.

Additionally, with reference to FIG. 5, representative structure 306 can be divided into multiple effective medium layers (i.e., layers $t_l$ to $t_n$). As depicted in FIG. 5, each effective medium layer can include a homogeneous area 308 and edges 310. As also depicted in FIG. 5, the thickness of the multiple effective medium layers can be varied. Additionally, the ratio between the homogeneous area 308 and edges 310, which corresponds to the values of $w_1$ and $w_2$ as described above, can be varied. The effective refraction indices can then be used in generating a simulated diffraction signal used in optical metrology.

More particularly, in library-based optical metrology, a set of hypothetical profiles and corresponding simulated diffraction signals can be generated for varying amounts of edge roughness for structure 302 (FIG. 3). Thus, a measure of edge roughness (e.g., rms roughness) can be used as one of the parameters to characterize a hypothetical profile in generating a library of hypothetical profiles and corresponding simulated diffraction signals. The edge roughness of an actual structure can then be measured by obtaining a measured diffraction signal of the actual structure, comparing the measured diffraction signal to the library of simulated diffraction signals to determine a matching simulated diffraction signal and the hypothetical profile corresponding to the matching simulated diffraction signal. A roughness measurement for the structure can then be determined based on the edge of the hypothetical profile corresponding to the matching simulated diffraction signal.

In regression-based optical metrology, a simulated diffraction signal can be generated assuming a certain amount of edge roughness for an actual structure. The simulated diffraction signal can be compared to a measured diffraction signal of the actual structure. If the simulated diffraction signal matches the measured diffraction signal, the actual structure can be assumed to have the amount of edge roughness assumed in generated the simulated diffraction signal. If the simulated diffraction signal does not match the measured diffraction signal, then another simulated diffraction signal can be generated using another amount of edge roughness and compared to the measured diffraction signal.

In another exemplary embodiment, edge roughness measurements of a structure are obtained using total scattering/total integrated scattering (TS/TIS) and angle resolved scattering (ARS). More particularly, with reference to FIG. 6-A, assume that the structure is a periodic grating formed on a semiconductor wafer with a regular line/space pattern. As noted above; it should be recognized that the structure can be various types of structures formed on a semiconductor wafer, such as lines, vias, holes, and the like.

In the present example, as depicted in FIG. 6-A, assume that regular line/space pattern of the periodic grating includes an edge roughness. To measure the edge roughness, the regular line/space pattern can be considered as a periodic structure in one lateral direction (x) and a stochastic structure in the orthogonal direction (y). Thus, as depicted in FIG. 6-A, when illuminated with white or monochromatic light, depending on the azimuth angle φ of incidence, the edge roughness will cause an additional light response pattern that will for the most general case (φ≠0) be located at a cone. In the special case of φ=0 (classical diffraction case) or φ=90° (special "conical" diffraction case), the diffraction pattern and the "scatter" pattern can be found on lines that are orthogonal to each other.

For example, FIG. 6-B illustrates a scattering pattern for a specular reflected beam with intensity along the vertical axis and rotation of angle γ along the horizontal axis, where angle γ corresponds to rotation about the z' axis (FIG. 6-A). FIG. 6-C illustrates the received intensity distribution perpendicular to the specular reflected beam with intensity along the vertical axis and rotation of angle β along the horizontal axis, where angle β corresponds to rotation about the y-axis (FIG. 6-A). The diffraction peaks in x-direction due to the regular character of the pattern are spread in the y-direction due to the stochastic edge roughness.

With reference to FIG. 7, when using ARS to measure edge roughness, detector 112 of optical metrology system 100 (FIG. 1) can include an array of detectors 702. More particularly, as depicted in FIG. 7, a lens 704 directs the specular reflected light onto array of detectors 702, which records the angular distribution of the scattered light.

The signal from the array of detectors 702 can then be used to determine the edge roughness. More particularly, as noted above, for a surface with a rms surface roughness less than a quarter of the sensing wavelength (Rayleigh criterion), the measured angle resolved intensity distribution, which is referred to as bi-directional reflection distribution function (BRDF) directly translates into a power spectrum density (PSD) of the surface.

With reference to FIG. 9, the PSD is a measure of how much the various spatial frequencies contribute to the overall surface roughness (e.g., frequencies $f_1$, $f_2$, and $f_3$ depicted in FIG. 9). Additionally, a Fourier transform of the PSD is the auto-correlation function (ACF) of the surface. See, John C. Stover, "Optical Scattering," SPIE Optical Engineering Press, Second Edition, Bellingham Wash. 1995, which is incorporated herein by reference in its entirety.

In addition to measuring the edge roughness, as depicted in FIG. 8, one of the signals from one of the detectors in array of detectors 702 (i.e., detector 802) can be used to extract the deterministic profile of the structure. More particularly, detector 802 corresponds to the detector in the array of detectors 702 in the specular direction. The signal from detector 802 is used to generate the simulated diffraction signal used in the library-based and/or regression-based process described above to determine the deterministic profile of the structure.

With reference again to FIG. 7, in an alternative embodiment, rather than using array of detectors 702, detector 112 can be translated to obtain the angular distribution of the scattered light. In this alternative embodiment, the measurement taken by detector 112 in a position corresponding to the location of detector 802 (FIG. 8) in array of detectors 702 is used to determine the deterministic profile of the structure as described above.

With reference to FIGS. 10 and 11, when using TS/TIS to measure edge roughness, detector 112 of optical metrology system 100 (FIG. 1) can include detector 1002 for measuring edge roughness and detector 1004 for determining the deterministic profile of the structure. More particularly, as depicted in FIG. 10, a reflecting sphere 1006, such as a Coblentz sphere, integrates and directs the scattered light onto detector 1002. The signal from this detector can then be used to determine the edge roughness. As noted above, for a surface with a rms surface roughness less than a quarter of the sensing wavelength (Rayleigh criterion), the measured scattered light is directly proportional to the rms roughness of the surface.

Additionally, the signal from detector 1004 can be used to determine the deterministic profile of the structure. More particularly, the signal from detector 1004 is used to generate the simulated diffraction signal used in the library-based and/or regression-based process described above to determine the deterministic profile of the structure.

As described above, the structure can be a two dimensional structure such as a contact hole. With reference to FIG. 12, contact holes can be formed with various edge defects, which are referred to as "wigglings" or "striations." With reference to FIG. 13, the resulting diffraction/scatter pattern from contact holes are more complicated since diffraction and scattering occurs in two dimensions. For example, the diffraction peaks can be smeared out in two dimensions.

In the present exemplary embodiment, detectors can be arranged in two dimensions to measure edge roughness of a two-dimensional structure. For example, with reference again to FIG. 11, when using TS/TIS to measure edge roughness, a detector 1002 can be used in one dimension, and another detector 1002 can be used in another dimension. With reference again to FIG. 8, when using ARS to measure edge roughness, an array of detectors 702 can be used to receive an angular distribution of scattered light in one dimension, and another array of detectors 702 can be used to receive an angular distribution of scattered light in another dimension. Alternatively, a detector can be translated to receive angular distributions of scattered light in the two dimensions. A PSD can then be generated for each of the dimensions, and the spatial frequency content can be obtained from the PSDs. For example, structures (e.g., contact holes) that possess curvy irregularities such as "wigglings" are assigned to low spatial frequencies (e.g., $f_1$ in FIG. 9) whereas dense fuzzy perturbations can be identified at higher spatial frequencies (e.g., $f_3$ in FIG. 9).

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching.

We claim:

1. A method of measuring edge roughness and deterministic profile of a structure formed on a semiconductor wafer using optical metrology, the method comprising:
   directing an incident beam on the structure using a source;
   receiving a diffracted beam from the structure using a detector; and
   processing the received diffracted beam using a processor to determine a deterministic profile and to measure an edge roughness of the structure.

2. The method of claim 1, wherein receiving a diffracted beam comprises:
   receiving an angular distribution of diffracted beams,
   wherein the edge roughness of the structure is measured based on the angular distribution of diffracted beams, and
   wherein the deterministic profile of the structure is determined based on one of the diffracted beams in the angular distribution of diffracted beams.

3. The method of claim 2, wherein the angular distribution of diffracted beams is received using an array of detectors, and wherein the diffracted beam processed to determine the deterministic profile of the structure is received using one of the detectors in the array of detectors.

4. The method of claim 3, wherein receiving an angular distribution of diffracted beams comprises:
   receiving a first angular distribution of diffracted beams using a first array of detectors in a first dimension; and
   receiving a second angular distribution of diffracted beams using a second array of detectors in a second dimension.

5. The method of claim 2, wherein the angular distribution of diffracted beams is received by translating the detector across a range of angles, and wherein the diffracted beam processed to determine the deterministic profile of the structure is received by translating the detector to one of the angles in the range of angles.

6. The method of claim 5, wherein receiving an angular distribution of diffracted beams comprises:
   receiving a first angular distribution of diffracted beams by translating the detector across a range of angles in a first dimension; and
   receiving a second angular distribution of diffracted beams by translating the detector across a range of angles in a second dimension.

7. The method of claim 1, wherein receiving a diffracted beam comprises:
   receiving an angular distribution of diffracted beams using a lens;
   integrating the angular distribution of diffracted beams using the lens; and
   directing the integrated angular distribution of diffracted beams to a first detector,
      wherein the edge roughness of the structure is measured based on the integrated angular distribution of diffracted beams; and
   receiving a diffracted beam using a second detector,
      wherein the deterministic profile of the structure is determined based on the diffracted beam received using the second detector.

8. The method of claim 7, wherein receiving an angular distribution of diffracted beams comprises:
   receiving a first angular distribution of diffracted beams in a first dimension; and
   receiving a second angular distribution of diffracted beams in a second dimension.

9. The method of claim 1, wherein processing the received diffracted beam using a processor to measure an edge roughness of the structure comprises:
   obtaining a measured diffraction signal based on the received diffracted beam;
   obtaining a simulated diffraction signal,
      wherein the simulated diffraction signal corresponds to a hypothetical profile of the structure, and
      wherein the hypothetical profile includes an edge having an effective refraction index;
   comparing the measured diffraction signal to the simulated diffraction signal; and
   when the measured diffraction signal and simulated diffraction signal match within a matching criterion, determining a roughness measurement for the structure corresponding to the edge of the hypothetical profile that corresponds to the simulated diffraction signal.

10. The method of claim 9, wherein the effective refraction index is an average of refraction indices of two materials.

11. The method of claim 10, wherein one of the two materials is air.

12. The method of claim 9 further comprising:
when the measured diffraction signal and simulated diffraction signal do not match within a matching criterion, obtaining a different simulated diffraction signal to compare with the measured diffraction signal, wherein the different simulated diffraction signal corresponds to a hypothetical profile with an edge having an effective refraction index different than that of the simulated diffraction signal.

13. The method of claim 12, wherein the different simulated diffraction signal is obtained from a library of simulated diffraction signals.

14. The method of claim 12, wherein the different simulated diffraction signal is generated by the processor.

15. The method of claim 9, wherein the hypothetical profile of the structure corresponds to at least one deterministic characteristic of the structure, and wherein processing the received diffracted beam using a processor to determine a deterministic profile of the structure comprises:
when the measured diffraction signal and simulated diffraction signal match within a matching criterion, determining a deterministic characteristic for the structure based on the at least one deterministic characteristic of the structure corresponding to the hypothetical profile.

16. The method of claim 15, wherein the at least one deterministic characteristic comprises a height, a width, a critical dimension, or a line width.

17. A computer-readable storage medium containing computer executable instructions for causing a computer to measure edge roughness and deterministic profile of a structure formed on a semiconductor wafer using optical metrology, comprising instructions for:
directing an incident beam on the structure using a source;
receiving a diffracted beam from the structure using a detector; and
processing the received diffracted beam using a processor to determine a deterministic profile and to measure an edge roughness of the structure.

18. The computer-readable storage medium of claim 17, wherein receiving a diffracted beam comprises:
receiving an angular distribution of diffracted beams,
wherein the edge roughness of the structure is measured based on the angular distribution of diffracted beams, and
wherein the deterministic profile of the structure is determined based on one of the diffracted beams in the angular distribution of diffracted beams.

19. The computer-readable storage medium of claim 18, wherein the angular distribution of diffracted beams is received using an array of detectors, and wherein the diffracted beam processed to determine the deterministic profile of the structure is received using one of the detectors in the array of detectors.

20. The computer-readable storage medium of claim 19, wherein receiving an angular distribution of diffracted beams comprises:
receiving a first angular distribution of diffracted beams using a first array of detectors in a first dimension; and
receiving a second angular distribution of diffracted beams using a second array of detectors in a second dimension.

21. The computer-readable storage medium of claim 18, wherein the angular distribution of diffracted beams is received by translating the detector across a range of angles, and wherein the diffracted beam processed to determine the deterministic profile of the structure is received by translating the detector to one of the angles in the range of angles.

22. The computer-readable storage medium of claim 21, wherein receiving an angular distribution of diffracted beams comprises:
receiving a first angular distribution of diffracted beams by translating the detector across a range of angles in a first dimension; and
receiving a second angular distribution of diffracted beams by translating the detector across a range of angles in a second dimension.

23. The computer-readable storage medium of claim 17, wherein receiving a diffracted beam comprises:
receiving an angular distribution of diffracted beams using a lens;
integrating the angular distribution of diffracted beams using the lens; and
directing the integrated angular distribution of diffracted beams to a first detector,
wherein the edge roughness of the structure is measured based on the integrated angular distribution of diffracted beams; and
receiving a diffracted beam using a second detector,
wherein the deterministic profile of the structure is determined based on the diffracted beam received using the second detector.

24. The computer-readable storage medium of claim 23, wherein receiving an angular distribution of diffracted beams comprises:
receiving a first angular distribution of diffracted beams in a first dimension; and
receiving a second angular distribution of diffracted beams in a second dimension.

25. The computer-readable storage medium of claim 17, wherein processing the received diffracted beam using a processor to measure an edge roughness of the structure comprises:
obtaining a measured diffraction signal based on the received diffracted beam;
obtaining a simulated diffraction signal,
wherein the simulated diffraction signal corresponds to a hypothetical profile of the structure, and
wherein the hypothetical profile includes an edge having an effective refraction index;
comparing the measured diffraction signal to the simulated diffraction signal; and
when the measured diffraction signal and simulated diffraction signal match within a matching criterion, determining a roughness measurement for the structure corresponding to the edge of the hypothetical profile that corresponds to the simulated diffraction signal.

26. The computer-readable storage medium of claim 25 further comprising:
when the measured diffraction signal and simulated diffraction signal do not match within a matching criterion, obtaining a different simulated diffraction signal to compare with the measured diffraction signal, wherein the different simulated diffraction signal corresponds to a hypothetical profile with an edge having an effective refraction index different than that of the simulated diffraction signal.

27. The computer-readable storage medium of claim 26, wherein the different simulated diffraction signal is obtained from a library of simulated diffraction signals.

28. The computer-readable storage medium of claim 26, wherein the different simulated diffraction signal is generated by the processor.

29. The computer-readable storage medium of claim 25, wherein the hypothetical profile of the structure corresponds to at least one deterministic characteristic of the structure, and wherein processing the received diffracted beam using a processor to determine a deterministic profile of the structure comprises:
when the measured diffraction signal and simulated diffraction signal match within a matching criterion, determining a deterministic characteristic for the structure based on the at least one deterministic characteristic of the structure corresponding to the hypothetical profile.

30. The computer-readable storage medium of claim 29, wherein the at least one deterministic characteristic comprises a height, a width, a critical dimension, or a line width.

31. A system of measuring edge roughness and deterministic profile of a structure formed on a semiconductor wafer using optical metrology, the system comprising:
a source of incident light that directs the incident beam on the structure;
a detector that receives a diffracted beam from the structure; and
a processor that processes the received diffracted beam to determine a deterministic profile of the structure and to measure an edge roughness of the structure.

32. The system of claim 31, wherein the diffracted beam received by the detector comprises:
an angular distribution of diffracted beams,
wherein the edge roughness of the structure is measured based on the angular distribution of diffracted beams, and
wherein the deterministic profile of the structure is determined based on one of the diffracted beams in the angular distribution of diffracted beams.

33. The system of claim 32, wherein the detector comprises:
an array of detectors that receives the angular distribution of diffracted beams, and wherein the diffracted beam processed to determine the deterministic profile of the structure is received using one of the detectors in the array of detectors.

34. The system of claim 33, wherein the array of detectors comprises:
a first array of detectors that receives a first angular distribution of diffracted beams in a first dimension; and
a second array of detectors that receives a second angular distribution of diffracted beams in a second dimension.

35. The system of claim 32, wherein the angular distribution of diffracted beams is received by translating the detector across a range of angles, and wherein the diffracted beam processed to determine the deterministic profile of the structure is received by translating the detector to one of the angles in the range of angles.

36. The system of claim 35, wherein the detector is translated across a range of angles in a first dimension to receive a first angular distribution of diffracted beams and translated across a range of angles in a second dimension to receive a second angular distribution of diffracted beams.

37. The system of claim 31 further comprising:
a lens that receives an angular distribution of diffracted beams and integrates the angular distribution of diffracted beams; and
wherein the detector comprises:
a first detector that receives the integrated angular distribution of diffracted beams, wherein the edge roughness of the structure is measured based on the integrated angular distribution of diffracted beams, and
a second detector that receives a diffracted beam, wherein the deterministic profile of the structure is determined based on the diffracted beam received using the second detector.

38. The system of claim 37, wherein the first detector receives a first angular distribution of diffracted beams in a first dimension, and further comprising
a third detector that receives a second angular distribution of diffracted beams in a second dimension.

39. The system of claim 31, wherein the processor processes the received diffracted beam by:
obtaining a measured diffraction signal based on the received diffracted beam;
obtaining a simulated diffraction signal,
wherein the simulated diffraction signal corresponds to a hypothetical profile of the structure, and
wherein the hypothetical profile includes an edge having an effective refraction index;
comparing the measured diffraction signal to the simulated diffraction signal; and
when the measured diffraction signal and simulated diffraction signal match within a matching criterion, determining a roughness measurement for the structure corresponding to the edge of the hypothetical profile that corresponds to the simulated diffraction signal.

40. The system of claim 39, wherein the effective refraction index is an average of refraction indices of two materials.

41. The system of claim 40, wherein one of the two materials is air.

42. The system of claim 39, wherein when the measured diffraction signal and simulated diffraction signal do not match within a matching criterion, a different simulated diffraction signal is obtained and compared with the measured diffraction signal, wherein the different simulated diffraction signal corresponds to a hypothetical profile with an edge having an effective refraction index different than that of the simulated diffraction signal.

43. The system of claim 42, wherein the different simulated diffraction signal is obtained from a library of simulated diffraction signals.

44. The system of claim 42, wherein the different simulated diffraction signal is generated by the processor.

45. The system of claim 39, wherein the hypothetical profile of the structure corresponds to at least one deterministic characteristic of the structure, and when the measured diffraction signal and simulated diffraction signal match within a matching criterion, a deterministic characteristic for the structure is determined based on the at least one deterministic characteristic of the structure corresponding to the hypothetical profile.

46. The system of claim 45, wherein the at least one deterministic characteristic comprises a height, a width, a critical dimension, or a line width.

* * * * *